United States Patent [19]

Lauks et al.

[11] Patent Number: 4,954,087
[45] Date of Patent: Sep. 4, 1990

[54] STATIC-FREE INTERROGATING CONNECTOR FOR ELECTRIC COMPONENTS

[75] Inventors: Imants R. Lauks, Morrisville, Pa.; Michael P. Zelin, Plainsboro, N.J.

[73] Assignee: I-Stat Corporation, Princeton, N.J.

[21] Appl. No.: 489,844

[22] Filed: Mar. 2, 1990

Related U.S. Application Data

[63] Continuation of Ser. No. 187,665, Apr. 27, 1988, abandoned.

[51] Int. Cl.$^5$ .................... H01R 9/09; H01R 13/648
[52] U.S. Cl. .................................. 439/71; 439/92; 439/188; 361/413; 200/51.1; 174/51
[58] Field of Search ............... 174/51; 200/51.1; 361/412, 413; 439/70–72, 76, 92, 93, 95, 188, 260, 264, 620

[56] References Cited

U.S. PATENT DOCUMENTS

| | | | |
|---|---|---|---|
| 3,903,385 | 9/1975 | Moyer et al. | 361/413 |
| 4,070,557 | 1/1978 | Ostapovitch | 439/188 |
| 4,671,599 | 6/1987 | Olsson | 439/188 |
| 4,786,258 | 11/1988 | Shaffer et al. | 439/188 |

*Primary Examiner*—Paula A. Bradley
*Attorney, Agent, or Firm*—Pennie & Edmonds

[57] ABSTRACT

An improved connector for connection to and identification and testing of electric components such as integrated circuits is described which features a number of spring biased contact elements normally in contacting relation with a shorting bar. When a particular component is placed in a specified physical relation to the connector, a combination of exposed electrical contacts and nonconductive elements on the component to be tested displace specified ones of the contact members away from the shorting bars, providing a connection pattern which can be detected. At the same time, test signals can be applied to the electric component to be tested. The circuit may be identified and its specific parameters identified and characterized in a single operation according to the invention. Advantageously, the shorting bar is grounded so that any static charge on the component to be tested is grounded before the contact elements are displaced from the shorting bar.

13 Claims, 4 Drawing Sheets

STATIC-FREE INTERROGATING CONNECTOR FOR ELECTRIC COMPONENTS

This is a continuation of application Ser. No. 187,665, filed Apr. 27, 1988, now abandoned.

FIELD OF THE INVENTION

This invention relates to an improved connector for electric components. In addition, this invention relates to a connector which is also useful for automatically identifying a particular component such as a passive circuit or an integrated circuit as being a member of one of several classes of components. The connector avoids certain common connection problems, such as damage caused by static electricity or the like.

BACKGROUND OF THE INVENTION

Normally, electric components are identified by visual inspection of identification data printed on labels, directly on the component, or similarly. However, it is desirable to provide automatic identification of a particular circuit as belonging to a class of circuits. For example, it is desirable to automatically identify a particular circuit as being one of a particular class upon placing the circuit into a test apparatus, such that the test apparatus is able to select appropriate test signals or other test conditions to apply to the circuit for test, evaluation, or calibration purposes. This would eliminate the requirement that the operator independently identify the type of circuit being tested, which in turn would reduce the chance of error in such procedures.

As is well known, integrated circuits employing complementary metal-oxide semiconductor (CMOS) elements must be shielded from any static electricity on any circuit to which they are connected because CMOS elements are easily destroyed by electric charge. Accordingly, in the design of a connector device for use with CMOS circuits, it is desirable that means be provided to ground any static electricity appearing either on the connector itself or on the circuits to be connected to avoid catastrophic damage to the CMOS elements. As is known in the art, CMOS elements are advantageously used in test circuits because of their favorable operating characteristics in the amplification of low-level signals.

SUMMARY OF THE INVENTION

The present invention provides a connector device for making connections to an electric circuit. It can be used for connections to all manner of electric circuits but is especially useful in making connection to integrated circuits as will be detailed below. The connector comprises a housing which carries a number of contact members which each comprise stationary and movable portions. In a preferred embodiment of the invention, the movable portions are normally disposed in rest positions in which they are in electrically conductive relation with a grounded shorting bar. When a circuit is connected to the connector device, some of the movable portions of the contact members are displaced, such that their disconnection from the shorting bar can be detected.

The inventive connector device can be employed to detect which of its contact members have been displaced by connection to circuit elements on the circuit connected to the device, which have been displaced by nonactive elements on the circuit, and which have not been displaced. A sequence of signals derived from this information can be compared to stored predetermined sequences of signals to identify or classify the circuit that has been connected.

The fact that the contact members are all connected to the grounded shorting bar prior to their displacement therefrom advantageously provides a convenient means of absorbing any static electricity on the contact members or on the circuit that has been connected to the connector device.

BRIEF DESCRIPTION OF THE DRAWING

These and other objects, features and advantages of the invention will be better understood from the accompanying drawing, in which.

DESCRIPTION OF THE PREFERRED EMBODIMENTS

Figure 1:
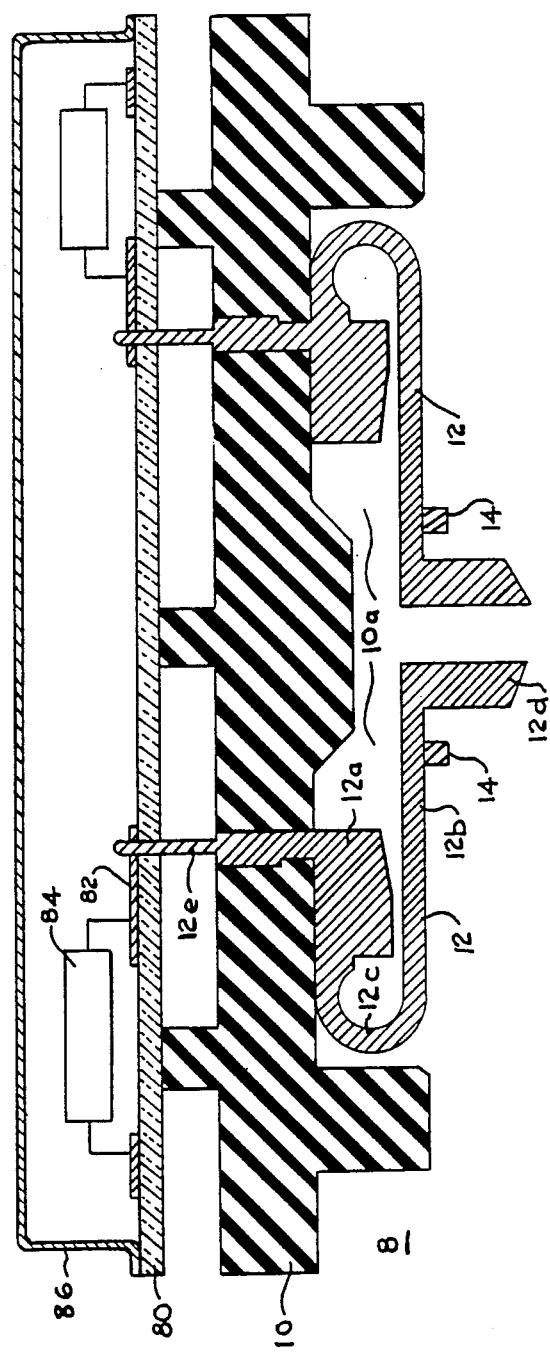
FIG. 1 shows a cross-sectional view of a connector according to the invention.
Figure 2:
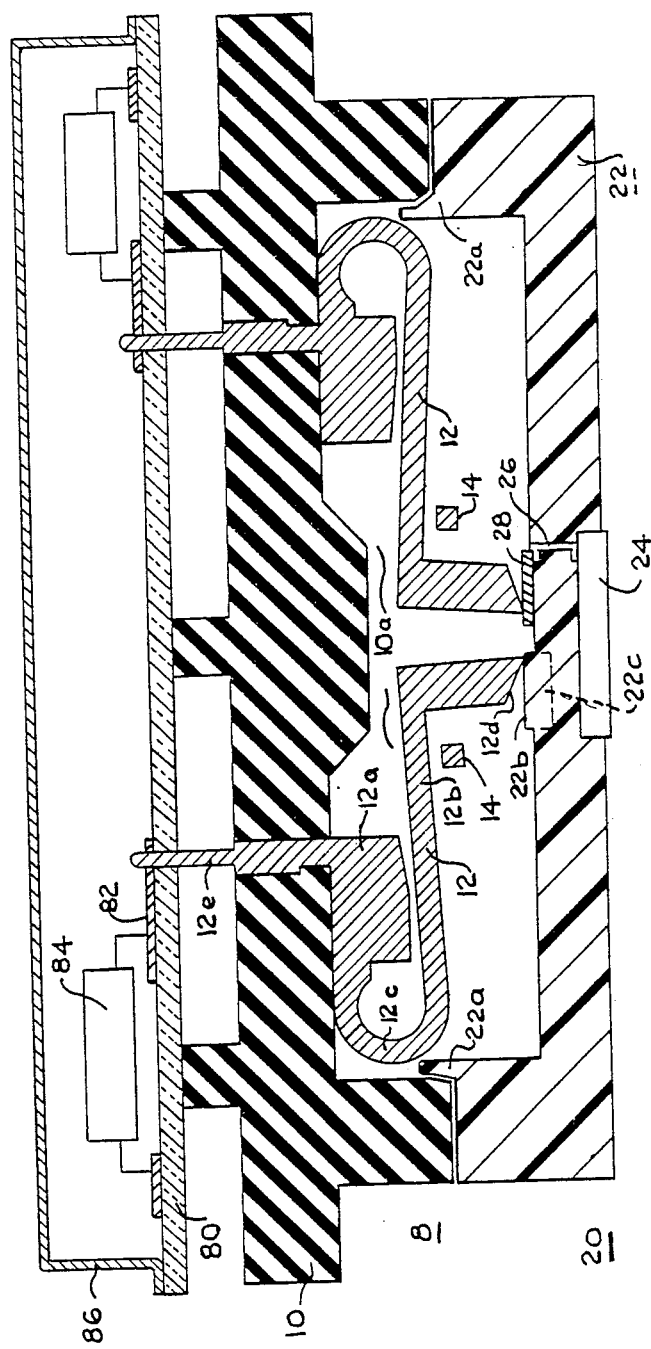
FIG. 2 shows a cross-sectional view comparable to that of FIG. 1, the connector having had an electric component connected thereto.

As mentioned, FIG. 1 shows a cross-sectional view of a connector 8 according to the invention, while FIG. 2 shows a corresponding view thereof after an electric component 20 has been inserted therein. In the following, identical reference numerals are used with respect to each view.

Connector 8 according to the invention comprises a housing 10 which carries a plurality of contact members 12. The housing 10 is shaped to comprise a recess 10a in which the contact members 12 are disposed, and which is shaped to receive electric components to be connected in a predetermined physical relation, such that the contact members 12 are directly juxtaposed to electrical contact elements on the component in a predetermined manner. As can be seen, each contact member 12 comprises a stationary portion 12a which is fixed with respect to the housing 10, and a movable portion 12b which is joined to the fixed portion by a U-shaped portion 12c, such that the contact member is biased outwardly. This allows a probe portion 12d of the contact member 12 to be displaced somewhat when brought into direct contact with an electric component to be tested. If the electric component comprises a contact element which is contacted by the contact member 12, very reliable electrical contact is made therebetween.

On the opposite side of housing 10 is mounted a printed circuit board 80 on which are disposed printed wiring 82 and electronic packages 84 such as integrated circuits. Illustratively, the signals from the components that are connected to contacts 12 are low-level, high impedance signals and the circuitry on board 80 is used to amplify such signals and convert them to low impedance signals for transmission to test circuitry. In such circumstances the integrated circuits are likely to be very sensitive to noise and vulnerable to damage by static. Noise protection is provided by encasing the circuit board in a conductive metal cover 86.

To protect against static, the housing 10 also has mounted thereto two or more grounded shorting bars 14. As shown in FIG. 1, the contact members 12 are shaped to be biased into electrically conductive relation with the shorting bars, which thus define the rest positions of the contact members. Thus, if a voltage is applied to any one of the contact members 12, one of shorting bars 14 will ground that voltage as long as the contact member 12 is in the rest position.

FIG. 2 depicts a view comparable to FIG. 1, wherein an electric component 20 has been connected to the connector 8 of the invention by moving at least one of connector 8 and component 20 toward the other in the direction indicated by the double-headed arrow of FIG. 2. Suitable means for effecting such motion will be apparent to those skilled in the art. The electric component 20 includes a body portion 22 which is shaped to comprise key means 22a interfitting with the housing 10 of the connector in a predetermined manner, such that a predetermined physical relationship is established therebetween. Alternatively, other locating means such as alignment pins may be used. Mounted in the body 22 of component 20 is, illustratively, an integrated circuit chip 24 comprising active circuit components. Integrated circuit chip 24 is connected by conductors 26 extending through the body portion 22 or otherwise to one or more contact elements 28. Contact element 28 as shown is in electrical contact with the probe portion 12d of one of the contact members 12 of the connector 8 of the invention. Thus, when the electric component 20 is placed into the predetermined physical relationship with the connector 8, one or more contact members 12 are displaced from their rest position against the shorting bar 14, creating an open circuit therebetween.

The body 22 of the electric component 20 to be tested may also be formed to comprise one or more raised members 22b, which similarly displace other contact members 12 from the shorting bar 14. An open circuit is again created. According to the invention, the connector 8 may be employed in connection with a device for distinguishing between contact members 12 which are connected to the integrated circuit chip (as on the right of FIG. 2) upon displacement from their rest position against the shorting bar 14, and those which are simply open-circuited by raised members 22b formed on the body 22.

A third possibility is that a portion of the body 22 is shaped to comprise a recess 22c. This recess is aligned with a contact member so that when the electric component 20 to be tested is connected to the connector 8, the contact member 12 is not displaced from its electrically conductive relation with the shorting bar 14. As a result, the ground potential present on the shorting bar 14 will therefore continue to be detectable at the terminal portion 12e of that contact member 12.

There are thus three or more possible signal characteristics detectable at the terminal portions 12e of the contact members 12. More specifically, when an electric component 20 is connected to connector 8, a ground potential connected to the shorting bar 14 can be detected at the terminal portion 12e of a contact member 12 at locations where the body 22 of component 20 has a corresponding recess 22c, formed therein. An open circuit is detectable when a raised portion 22b of the body of the electric component is juxtaposed to the contact member 14 (left side of FIG. 2); and varying circuit characteristics may be detected, depending on the precise electrical characteristics of the integrated circuit chip 24, when the contact member contacts a contact element 28 connected to the chip (right side of FIG. 2). The combination of these three or more distinguishable signals provided at the various terminals 12e of the contact members 12 with respect to a particular electric component can conveniently be used to characterize the component, that is, to identify it as being a member of a particular class of components.

More particularly, it is readily possible to connect a microprocessor, analog to digital conversion circuitry, and an associated read-only memory (ROM) or the equivalent to the terminal portions 12e of the contact members 12, to compare the set of signals detected with respect to a particular electric component to a number of stored sets of signals, and to identify the particular electric component as belonging to a class of such components when a correspondence therebetween is detected.

Figure 3:
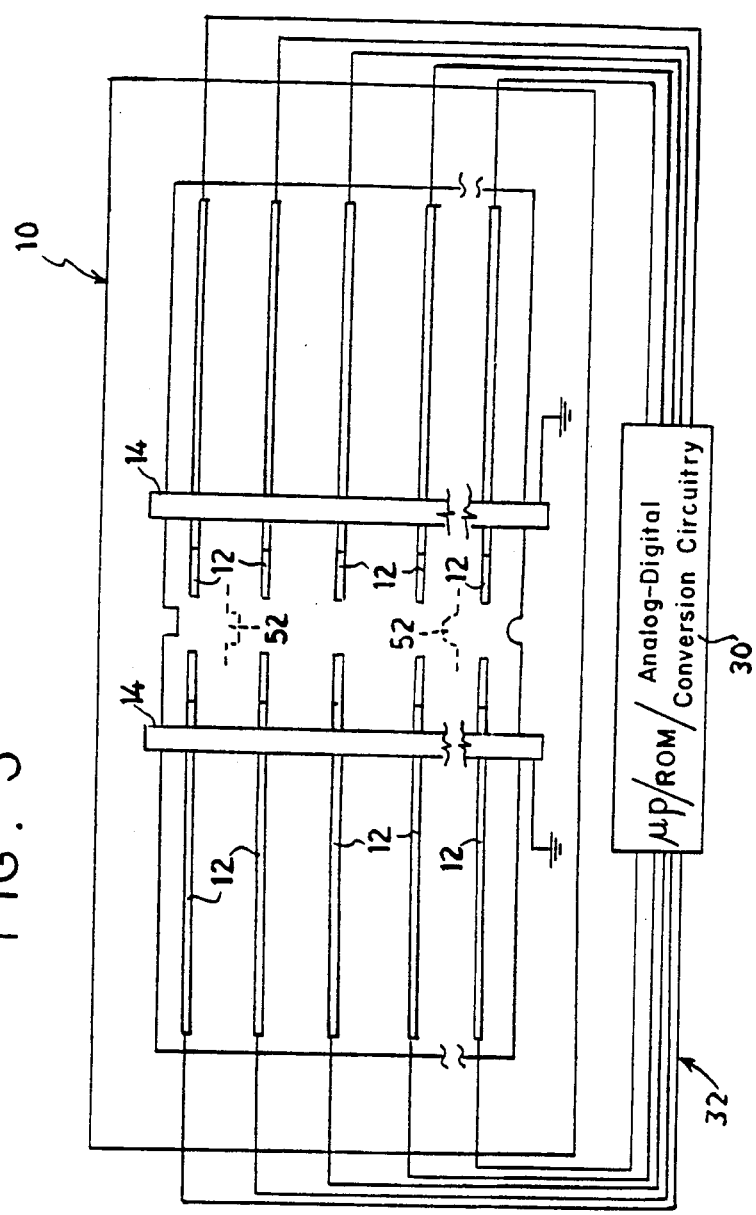
FIG. 3 shows a schematic circuit diagram of a device employing the connector according to the invention for use in identifying an electric component.

FIG. 3 shows a plan view of the connector 8 of the invention together with a schematic diagram of its connections to a device 30 for identifying a particular electric component juxtaposed thereto.

Shorting bars 14 are shown in FIG. 3 as connected to ground potential. A plurality of contact members 12 are also shown. Clearly, these can be multiplied to any degree desired. Contact members 12 are connected by conductors 32 to a microprocessor/ROM analog to digital conversion circuitry combination 30, by which a set of signals detected by way of the contact members 12 with respect to a particular electric component are compared to stored sets of comparable signals in order to determine the identity of the component.

Figure 4:
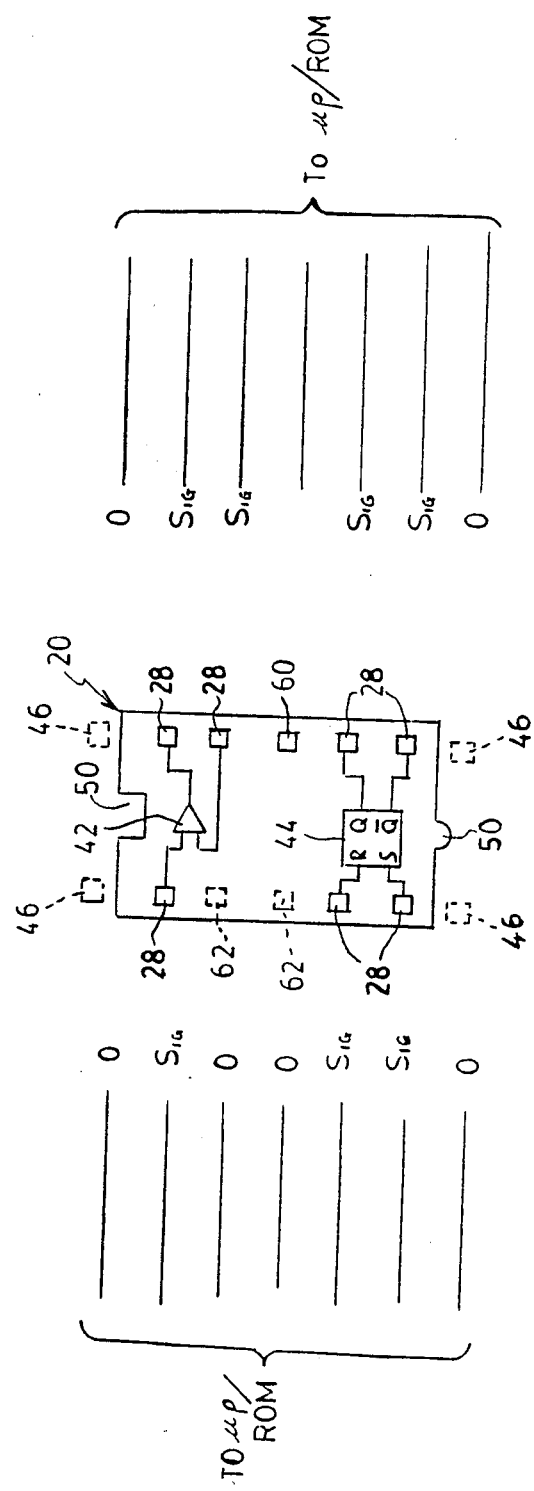
FIG. 4 shows schematically how the connector device derives sequences of identification signals from electric components to be tested according to the invention.

FIG. 4 shows an example of the signals which may be detected with respect to a particular electric component 20. The electric component 20 comprises two active electronic elements, depicted schematically as an amplifier 42 and a flip-flop 44, which are connected to seven contact elements 28 at ten possible locations on the body 22 of the component 20. In the example given, which is by no means limiting of the invention, the connector 8 includes two additional contact members 12 disposed at locations 46 at each end. That is, the connector 8 in the example can make connection with up to fourteen contact elements 28.

The electric component 20 has key means 50 for interacting with corresponding key means 52 (FIG. 3) formed on the connector 8 according to the invention, such that when the component 20 is placed in the predetermined physical relation to the connector 8, the contact elements 28 on the component 20 are precisely juxtaposed with respect to the contact members 12 on the connector 8. The connection of the contact elements 28 of the electric component 20 to the amplifier 42 and the flip-flop 44 can be detected by the microprocessor/ROM unit 30 when interrogated by appropriate signals.

Typical connections which may be detected are shown on the left and right sides of the diagram of FIG. 4. As indicated, a signal ("Sig") is present on the connecting pins 28 to which the amplifier 42 and flip-flop 44 are connected. That is, the fact that an active circuit element is connected to the contact member can be detected by supply of appropriate interrogation signals thereto. No signal is shown with respect to one location 60, where a raised member 22b displaces the corresponding contact member 12 from the shorting bar 14, and to which no circuit elements are connected, as shown on the right side of FIG. 2. A ground potential is shown at two positions 62 on the left side of FIG. 2 where a recess is formed in the component 20 such that the corresponding contact element is not displaced from the shorting bar 14. Finally, at the end positions 46 which are not affected by the presence of the component 20, the contact numbers 12 are not displaced from the shorting bars, and ground potential is also detected.

The fact that the contact members 12 are in contact with the shorting bars 14 prior to connection with component 20 prevents any buildup of static electricity prior to their contacting the component 20. Thus, even if the circuitry 84 comprises a very delicate CMOS circuit, it will not be damaged by static electricity. Moreover, when component 20 is first brought into contact with contact members 12, the contact members will still be in contact with shorting bars 14. As a result, any static electricity on component 20 will be discharged through contact members 12 and shorting bars 14 before the contact members are lifted off the shorting bars by component 20.

It will also be appreciated that after a particular component has been categorized by comparison of the signals detected via the contact members 12 to stored sets of signals, the component can be tested and characterized and/or calibrated by supplying particular signals thereto. This might conveniently be accomplished under the control of microprocessor/ROM analog to digital conversion circuitry unit 30. Advantageously, the particular signals applied to the component after identification can be varied depending on the identity of the component.

It will be recognized that a number of different interrogation signal sequences may be usefully employed in connection with the connector of the invention. For example, in a two-stage identification process, the component might first be characterized by identification of the contact elements thereof to which active circuit elements are connected. Thereafter, specified interrogation signals useful in differentiating one type of component having active elements connected to those contact elements from another may be applied, e.g., to some of the contact elements, and the results monitored. Similarly wide variation in the possible test and calibration signal sequences will also be apparent to those of skill in the art.

Therefore, while a preferred embodiment of the invention has been described, the above disclosure thereof should be considered as exemplary only and not as a limitation thereon. The invention is limited only by the following claims.

What is claimed is:

1. A connector for contacting an electric component comprising:
   a housing including means for locating said component in a specified physical relationship to said housing;
   a plurality of contact members carried by and biased with respect to said housing so as to be urged into physical contact with a predetermined electric component in said specified physical relationship to said housing;
   conductor means located such that at least some of said biased contact members are urged into electrically conductive relation with said conductor means when no electric component is in said specified physical relationship to said housing, and such that selected contact members are displaced out of their electrically conductive relation to said conductor means when an electric component is in said specified physical relationship to said housing, different combinations of said contact members being displaced by different electric components; and
   means connected to said contact members for determining the combination of displacements of said contact members when an electric component is in said specified physical relationship to said housing, and for identifying the component responsive thereto.

2. The connector of claim 1, wherein when an electric component is in said specified physical relationship to said housing at least some of the contact members are in electrically conductive relation to contact elements on said component, and wherein said at least some of the contact members are identified by said means for determining.

3. The connector of claim 2, wherein said means for identifying comprises means for comparing a combination of signals detected with respect to said contact members to stored data representing a plurality of stored combinations of signals, and for identifying the component responsive to correspondence between the detected combination of signals and one of the stored combinations of signals.

4. The connector of claim 3, further comprising means for application of predetermined signals to said component while in said specified physical relationship to said housing, and means for monitoring the response of the component thereto.

5. The connector of claim 3, wherein the components of each of a plurality of classes of electrical components provide unique combinations of signals to said contact members when in said specified physical relationship to said housing.

6. The connector of claim 5, wherein the components of each of the classes have physical configurations such that when the components are placed in said specified physical relationship to said housing different combinations of said contact members unique to each of said classes are displaced from their electrically conductive relation to said conductor means.

7. The connector of claim 6, wherein some of said combinations of said contact members are displaced by electrically insulative members on said component.

8. In combination, an electric component and a connector for making electrical connection to a plurality of exposed contact elements on the component, said component comprising a body comprising locating means and a number of exposed contact elements, said connector comprising a plurality of contact members and a housing, said housing including locating means for mating with said locating means on the component, such that the physical position of the contact elements on the component is defined with respect to the contact members of the connector,
   said contact members of said connector each comprising a fixed portion mounted in said housing, a terminal portion for electrical connection to a conductor, and a movable portion at least partially exposed with respect to said housing and adapted to engage a contact element on said electric component, at least said movable portion being biased into a rest position from which it is displaced when it engages a contact element on said component,
   said connector further comprising shorting means adapted to physically contact and be in electrically conductive relation with the movable portions of at least some of said contact members when in said rest position, said plurality of said contact members being arranged in at least one row and said shorting means comprising a conductive bar extending transversely to said row.

9. The combination of claim 8 wherein the shorting means is grounded.

10. The combination of claim 8 wherein different electric components displace different contact members.

11. The combination of claim 8, wherein said contact members are each formed to define a bent portion between said fixed portion and said movable portion, such that said bent portion flexes in order to provide said bias to said movable portion.

12. The combination of claim 11, wherein said shorting bar extends transversely to the movable portions of said row of contact members.

13. In combination, an electric component and a connector for making electrical connection to a plurality of exposed contact elements on the component, said component comprising a body comprising locating means and a number of exposed contact elements, said connector comprising a plurality of contact members and a housing, said housing including locating means for mating with said locating means on the component, such that the physical position of the contact elements on the component is defined with respect to the contact members of the connector, said contact members of said connector each comprising a fixed portion mounted in said housing, a terminal portion for electrical connection to a conductor, and a movable portion at least partially exposed with respect to said housing and adapted to engage a contact element on said electric component, at least said movable portion being biased into a rest position from which it is displaced when it engages a contact element on said component, said connector further comprising shorting means adapted to physically contact and be in electrically conductive relation with the movable portions of at least some of said contact members when in rest position, in further combination with means connected to said contact members for identifying a particular component responsive to interaction of the contact members with the particular component.

* * * * *